United States Patent
Hu et al.

(10) Patent No.: US 8,880,985 B2
(45) Date of Patent: Nov. 4, 2014

(54) HIGH-SPEED LONG CODEWORD QC-LDPC SOFT DECISION DECODER

(71) Applicant: NEC Laboratories America, Inc., Princeton, NJ (US)

(72) Inventors: Junqiang Hu, Princeton, NJ (US); Lei Xu, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 112 days.

(21) Appl. No.: 13/646,470

(22) Filed: Oct. 5, 2012

(65) Prior Publication Data

US 2013/0091399 A1    Apr. 11, 2013

Related U.S. Application Data

(60) Provisional application No. 61/543,349, filed on Oct. 5, 2011.

(51) Int. Cl.
*H03M 13/03* (2006.01)
*H03M 13/13* (2006.01)
*H03M 13/11* (2006.01)

(52) U.S. Cl.
CPC ............ *H03M 13/13* (2013.01); *H03M 13/116* (2013.01); *H03M 13/1117* (2013.01); *H03M 13/1145* (2013.01); *H03M 13/1137* (2013.01)
USPC .......................................... 714/786; 714/755

(58) Field of Classification Search
CPC ..... H04L 1/0057; H04L 1/005; H03M 13/11; H03M 13/1128; H03M 13/1131; H03M 13/255; H03M 13/6569; H03M 13/6577; H03M 13/1117; H03M 13/1137; H03M 13/1145; H03M 13/116; H03M 13/13
USPC ............ 714/752, E11.032, E11.03, 758, 774, 714/786, 800; 375/341

See application file for complete search history.

(56) References Cited

U.S. PATENT DOCUMENTS

| | | | |
|---|---|---|---|
| 2009/0259912 A1* | 10/2009 | Djordjevic et al. | 714/752 |
| 2010/0146365 A1* | 6/2010 | Yano et al. | 714/752 |
| 2010/0251059 A1* | 9/2010 | Dielissen | 714/752 |
| 2011/0138248 A1* | 6/2011 | Wu et al. | 714/752 |
| 2011/0252286 A1* | 10/2011 | Li et al. | 714/755 |

* cited by examiner

*Primary Examiner* — Guy Lamarre
(74) *Attorney, Agent, or Firm* — Joseph Kolodka

(57) ABSTRACT

A Quasi-Cyclic, LDPC, large girth, soft-decision decoder and accompanying methods.

13 Claims, 6 Drawing Sheets

HIGH-SPEED LONG CODEWORD QC-LDPC SOFT DECISION DECODER

TECHNICAL FIELD

This disclosure relates generally to the field of optical communications and in particular to a large girth quasi-cyclic low-density parity check (QC-LDPC) soft-decision decoder and FPGA implementation of same.

BACKGROUND

Higher speed optical transport over long distances requires powerful forward error correction (FEC). Low-density parity-check (LDPC) codes with soft decision decoder are believed to be promising candidates to help meet such requirements. This is due—in part—to their relatively low complexity and large error correction gain.

Prior investigations have shown that carefully designed QC-LDPC codes provide comparable performance to other types of LDPC codes, while their highly structured pattern makes QC-LDPC codes more hardware friendly. More recent studies have shown that large girth and long codeword QC-LDPC code may provide decoded BER (bit error ratio) performance of below $10^{-15}$ without error floor. Such LDPC codes are believed to be the promising candidates for advanced optical transport applications.

As recognized by those skilled in the art, implementing such advanced LDPC codes with large girth and long codeword is a challenging problem. Aspects of the problem include the requirement for high throughput while reducing fabrication cost(s) such as may result from fitting any design in to a single programmable device such as field programmable gate array (FPGA).

Consequently, methods, structures or techniques that address such aspects would represent a significant advance in the art.

SUMMARY

An advance in the art is made according to an aspect of the present disclosure directed to a structures and methods that facilitate high-speed long codeword QC-LDPC code implementation. According to an aspect of the present disclosure, the architecture is pipelined architecture, employing two stages of multiplexing for message passing between check nodes (C-nodes), variable nodes (V-nodes), and buffer sharing schemes, etc. Advantageously, devices constructed according to the present disclosure may use FPGA, but may also be provided via ASIC as well. Furthermore, the device so constructed may provide a 40 Gb/s full-speed soft-decision decoder implementation of a large girth QC-LDPC code, using 4 bit quantized resolution and 5 iterations.

Of particular interest, methods and structures according to the present disclosure employ a buffer sharing mechanism, and two multiplexing stages (i.e., sequence conversion) between C-node(s) and V-node(s).

BRIEF DESCRIPTION OF THE DRAWING

A more complete understanding of the present disclosure may be realized by reference to the accompanying drawings in which.

DETAILED DESCRIPTION

Figure 1A:
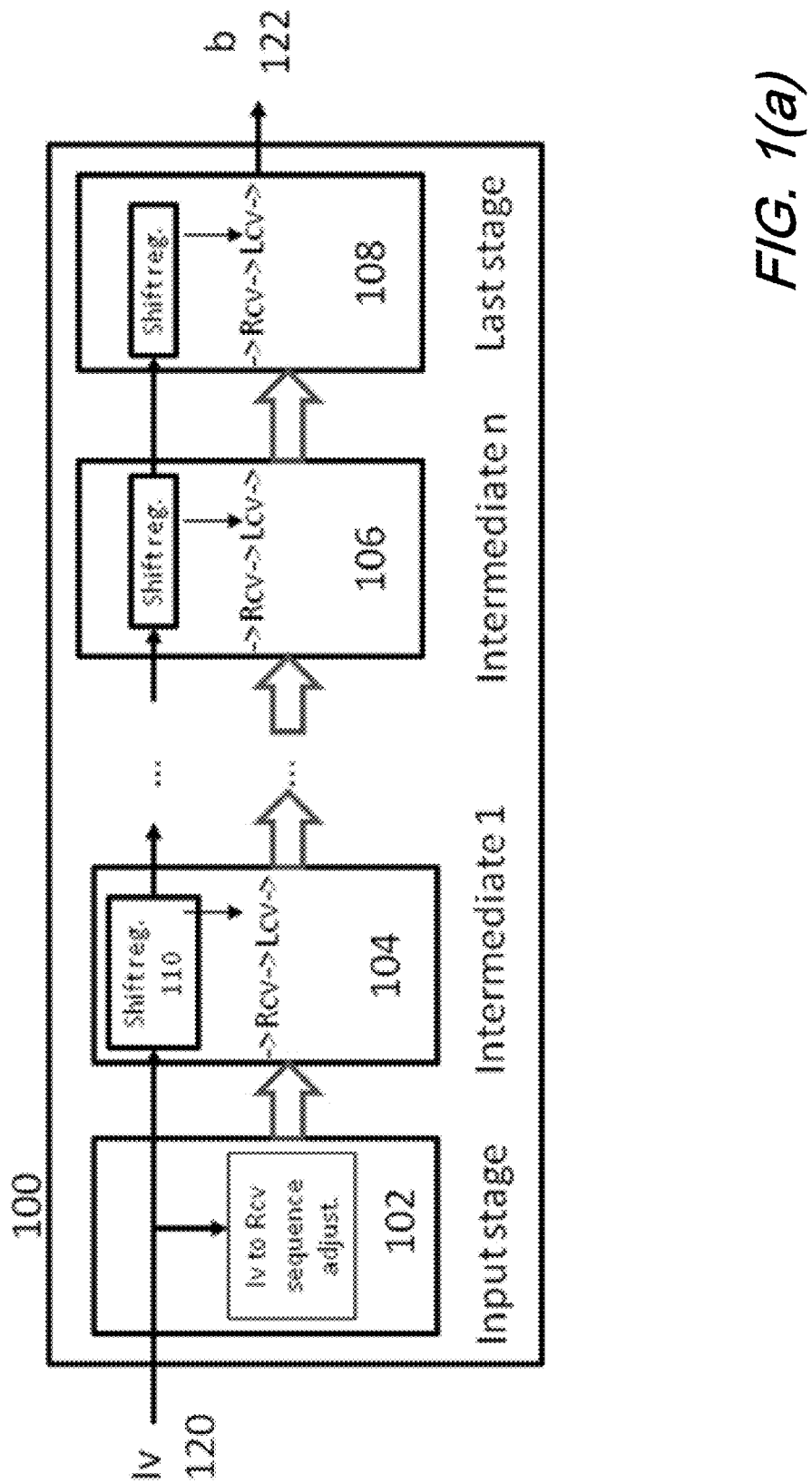
FIG. 1(a) is a schematic block diagram depicting an exemplary pipelined architecture according to an aspect of the present disclosure.
Figure 2A:
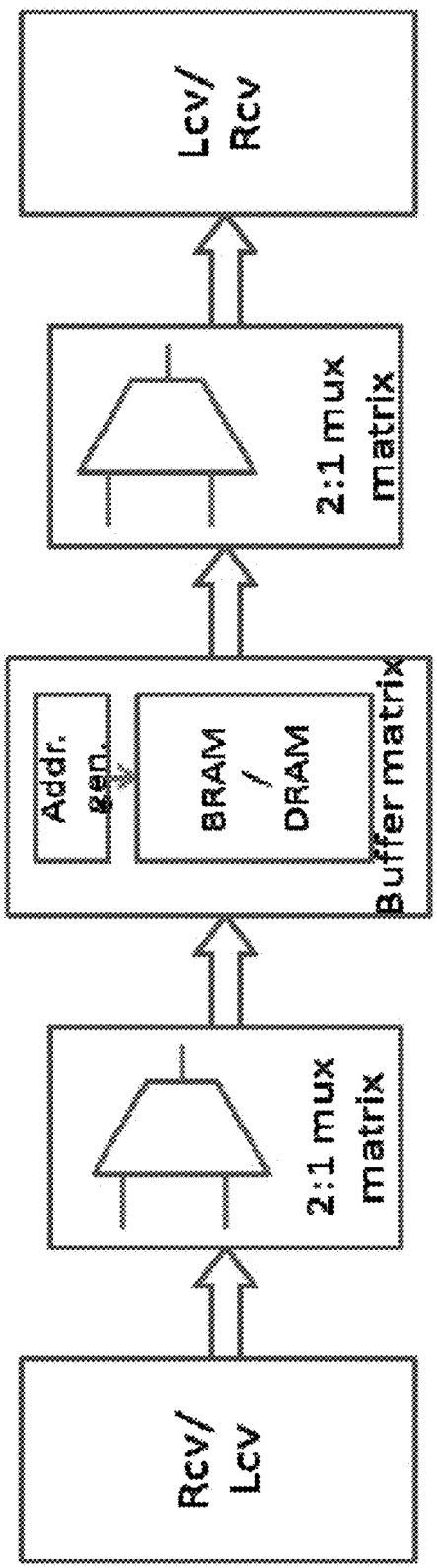
FIG. 2(a) is a schematic block diagram depicting an exemplary processing procedure with intermediate stages according to an aspect of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

By way of some additional background, we note that a selected code as used herein was reported by I. Djordjevic et al., in a paper entitled "Next Generation FEC for High-Capacity Communication in Optical Transport Networks", which appeared in IEEE JLT vol. 27, No. 16, August 2009, pp 3518-3530, which employs the following parity check matrix:

$$H = \begin{bmatrix} I & I & I & \ldots & I \\ I & pS[1] & pS[2] & \ldots & pS[c-1] \\ I & p2S[1] & p2S[2] & \ldots & p2S[c-1] \\ \ldots & \ldots & \ldots & \ldots & \ldots \\ I & p(r-1)S[1] & p(r-1)S[2] & \ldots & p(r-1)S[c-1] \end{bmatrix};$$

Where I is p×p (p is a prime number) identity matrix, P is p×p permutation matrix given by $P=(P_{ij})_{p,p}$, $P_{i,j+1}=P_{P,1}=1$, (zero otherwise), and where r and c represent the number of block-rows and block-columns respectively.

The set of integers are carefully chosen from the set $\{0, 1, \ldots, p-1\}$ to achieve large-girth. In particular, the selected code has p=1129, r=3, and c=15, which is (16935, 13550) code of girth=10. The column weight is 3, and row weight is 15.

As presently employed, the soft-decision decoding algorithm is a scaled min-sum algorithm (See, e.g., R. G. Gallager, "Low Density Parity Check Codes", IEE Trans. Inform. Theory, vol. IT-8, pp; 21-28, January, 1962), which is based on SPA (Sum-Product algorithm) (See, e.g., J. Chen et al. "Near Optimum Universal Belief Propagation Based Decoding of Low-Density Parity Check Codes", IEEE Trans. Comm., vol., 55, pp. 406-414, March 2002), As may be readily appreciated by those skilled in the art, SPA operational steps include:

1) Initialization:

$$L_{CV}=I_V \text{ for } v=1, 2, \ldots, N \text{ and } c=1, 2, \ldots, M.$$

2) Check-To-Variable Message Passing: Each check node c computes the check-to-variable message $R_{CV}$ with variable-to-check message $L_{CV}$.

$$R_{CV} = \prod_{n \in N(c) \setminus v} \text{sign}(L_{CN}) \times \Psi\left\{\sum_{n \in N(c) \setminus v} \Psi(|L_{CN}|)\right\}$$

where $$\Psi(\beta) = \ln\left(\frac{e^\beta + 1}{e^\beta - 1}\right).$$

3) Variable-to-check Message Passing: Each variable node v computes the variable-to-checkmessage $L_{CV}$ with check-to-variable message $R_{CV}$.

$$L_{CV}=\Sigma_{m \in M(v) \setminus c} R_{mv}+I_v$$

4) Tentative decision Parity Check: Each variable node v computes the LLR message $L_V$ and makes tentative decision.

$$L_V=\Sigma_{m \in M(v)} R_{mv}+I_v$$

$z=0$ if $L_v \geq 0$, $z_v=1$ otherwise

Scaled min-sum algorithm changes check node processing to the following:

$$R_{CV} = \alpha \times \prod_{n \in N(c) \setminus v} \text{sgn}(L_{CN}) \times \min_{n \in N(c) \setminus v} |L_{CN}|,$$

where $L_{CN}$ is the variable-to-check message (See, e.g, Z. Wang et al, "VLSI Design for Low-Density Parity Check Code Decoding", IEEE Circuits and Systems Magazine, pp. 52-69, Q1 2011).

Turning now to FIG. 1(a) there is shown a high level schematic block diagram depicting a pipelined architecture decoder 100 according to an aspect of the present disclosure. More specifically, such decoder includes an input stage 102, intermediate stages 104, ... 106, and a last stage 108. Each of the intermediate stages and the last stage perform one decoding iteration. Input stage 102 accepts as input a vector $I_v$ and converts to C-node processing sequence. Intermediate stages process include C-node operation, C-node to V-node processing sequence conversion, V-node operation and V-node to C-node processing sequence conversion.

As may be understood, the last stage performs similarly to the intermediate stages, except that an output sequence is converted from V-node sequence to a desired output sequence, plus decoded signal decision (i.e., to convert from multiple bits to a single bit). Notably, $I_v$ input has the same sequence as V-node operation, so a simple shift register 110 may advantageously be used within each intermediate stage and the last stage, to meet V-node operation timing.

In terms of the example LDPC code, apparatus and methods according to the present disclosure process all the row and column circulants in parallel, with each circulant having n nodes processed in one clock cycle. These n nodes are contiguous nodes within each circulant, that is, checking nodes $R_{cv}[i][1:n]$ ($i \in [1:r]$) are processed in the first clock cycle, $R_{cv}[i][n+1:2n]$ are processed in the second clock cycle using the same processing elements as the first cycle, and so on. The same procedure is applied to variable nodes $L_{cv}$. For the case of n=19 in the example code, the complete check nodes or variable nodes can be processed in 60 clock cycles, plus the necessary guard period for safe operation.

The processing procedure within the intermediate stages are C-node (Rcv) calculation, C-node outputs to buffer sequence conversion (through multiplexer), buffer array, buffer output to V-node (Lcv) calculation sequence conversion, V-node calculation, V-node outputs to buffer sequence conversion, buffer output to C-node sequence conversion.

Figure 3A:
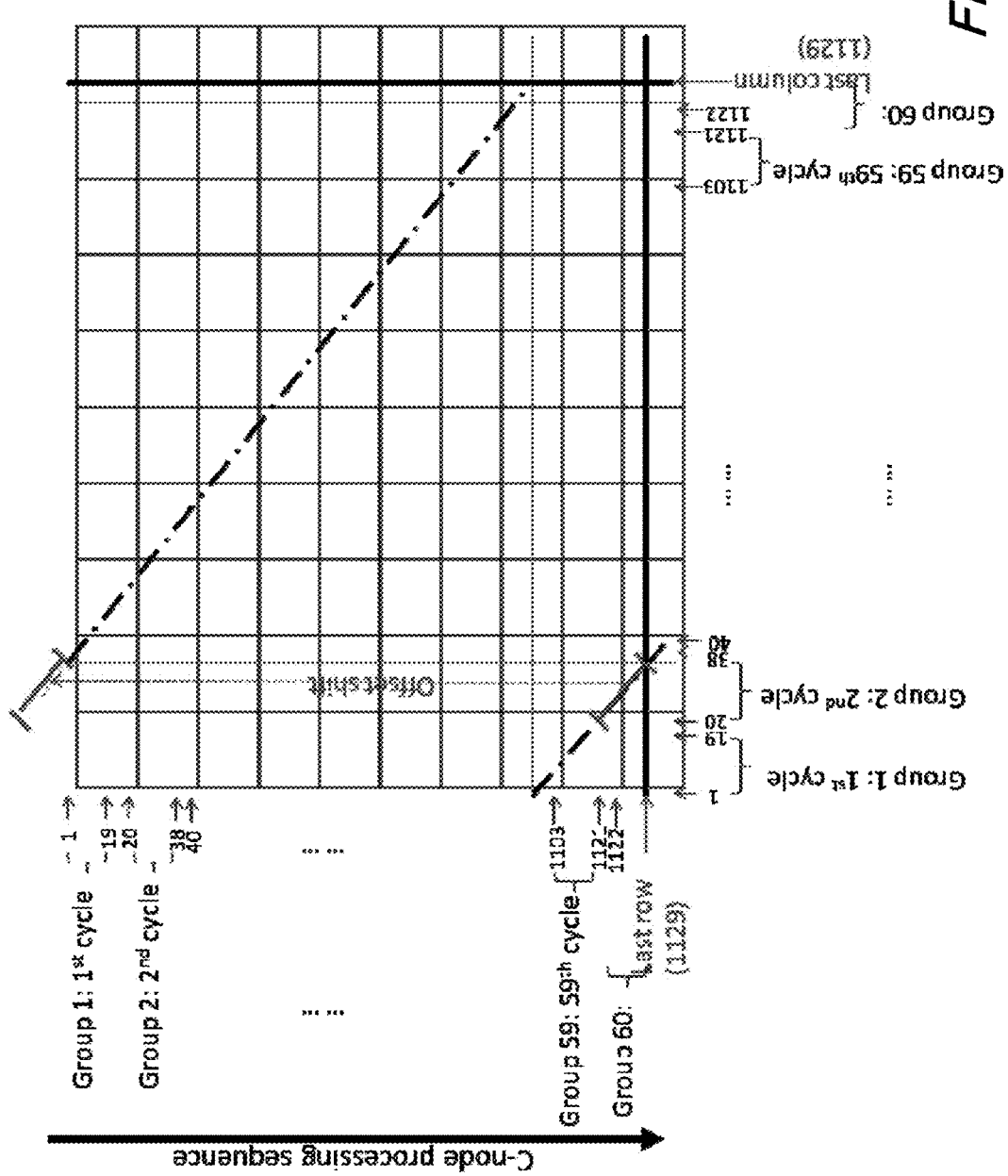
FIG. 3(a)-3(d) is a series of graphs showing processing group classification and buffering address shifting according to an aspect of the present disclosure.

According to the present disclosure, the Buffer organizing scheme is related to the processing sequence and circulant characteristics. Error! Reference source not found. (a) uses the example code circulant to explain the principle. With reference to that FIG. 3(a), the grid represents one circulant within the parity check matrix; rows represent C-nodes while columns represent V-nodes. From the above mentioned parallelization scheme, for C-node, the first clock cycle calculates row 1 through 19; second clock cycle calculates row 20 to 38, and so on, until the $60^{th}$ clock cycle, executes row 1122 to 1129 which is the last one. Same processing sequence is applied to V-node, from left to right columns. The — · — · lines represent the '1' elements in the circulant (all other areas are '0').

The buffer depicted in Error! Reference source not found. (a) is organized by group or cycle (virtual "segment" address—actually the buffer access address) and element (virtual "offset" address which is actually different location in a word). That is, "virtual" address 0-18 is used for the result of first clock cycle outputs, 19~37 for the result of $2^{nd}$ cycle outputs, and so on. This is called different segment. Within each segment, in general the first element is stored in "virtual" offset 0, last element in offset 18. However, for the last segment (and for some cases include some elements in the last $2^{nd}$ segment), the buffering scheme is different. For no-confliction buffer read access, the buffering offset address is shifted, to make it aligned with the first R-node group. That is, the result from node 1122~1129 is buffered in offset address 11~18, instead of 0~7 in other segments.

Similarly, the last m elements in segment 58 (for group 59) is buffered right above offset 11~18. Such offset shifting can be achieved by a 2:1 multiplexer. This is the aforementioned first multiplexer matrix. This stage of multiplexer is controlled by a signal generated from comparator logic, which compares current executing cycle with a constant value, for example 58 or 59, so both the multiplexer and the selection control signal can be implemented with simple logic. Buffer output selection for V-node is the second multiplexer matrix, which also consists of 2:1 multiplexers, and the mux selection is again generated by comparison logic. Buffer writing address (actual address) is always from 0 to 59, while each buffer has a locally address generator based on reading sequence.

Figure 3B:
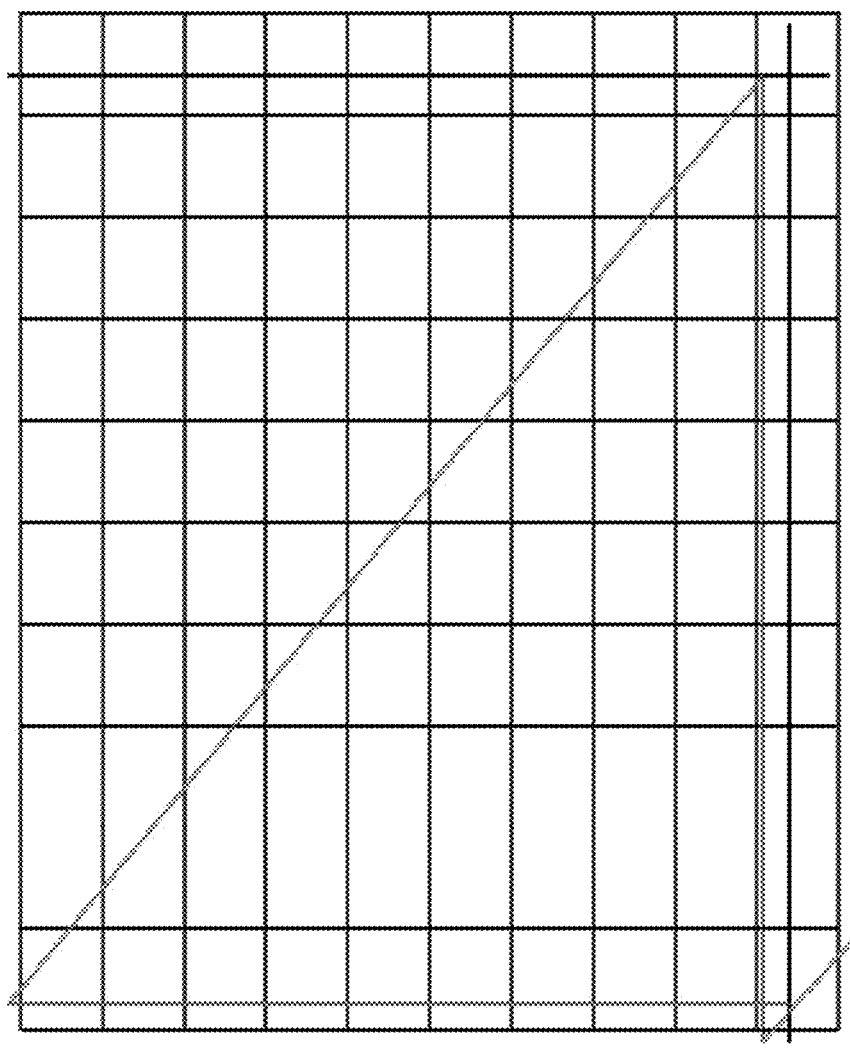
Figure 3C:
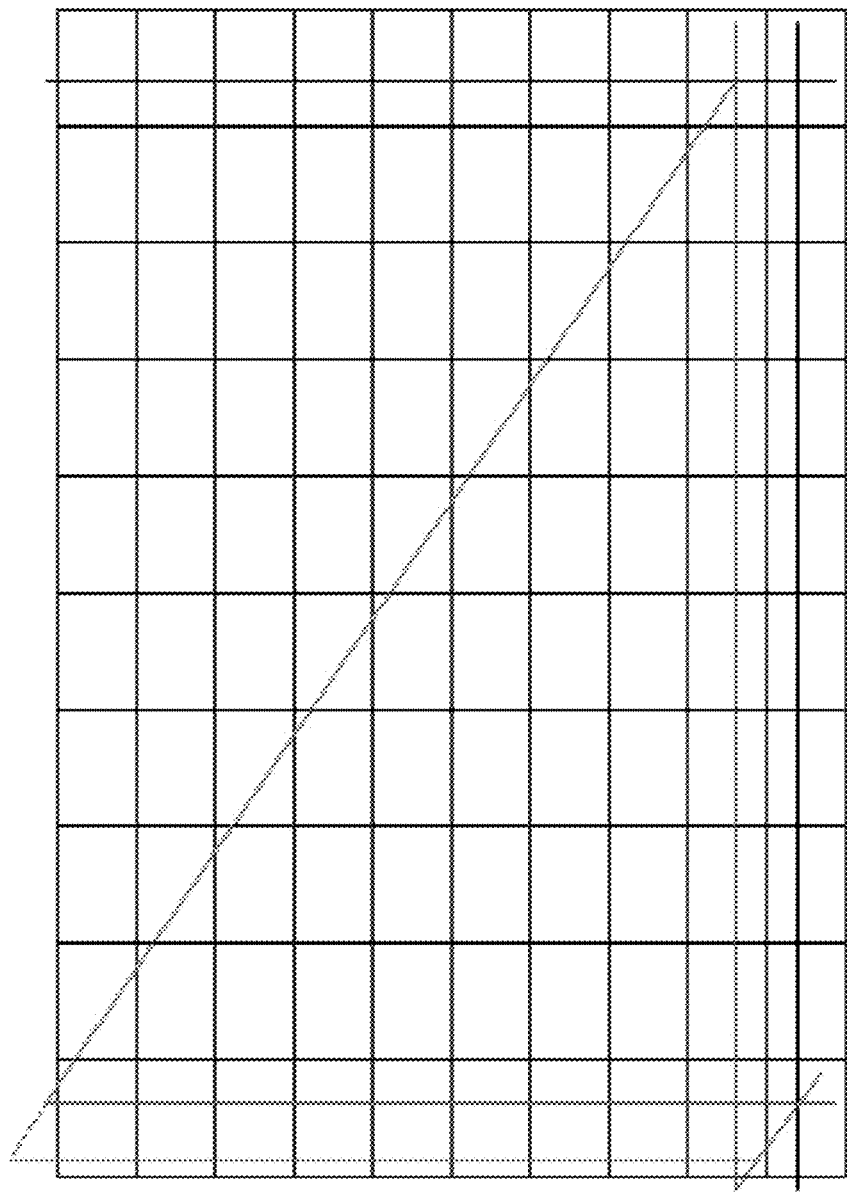
Figure 3D:
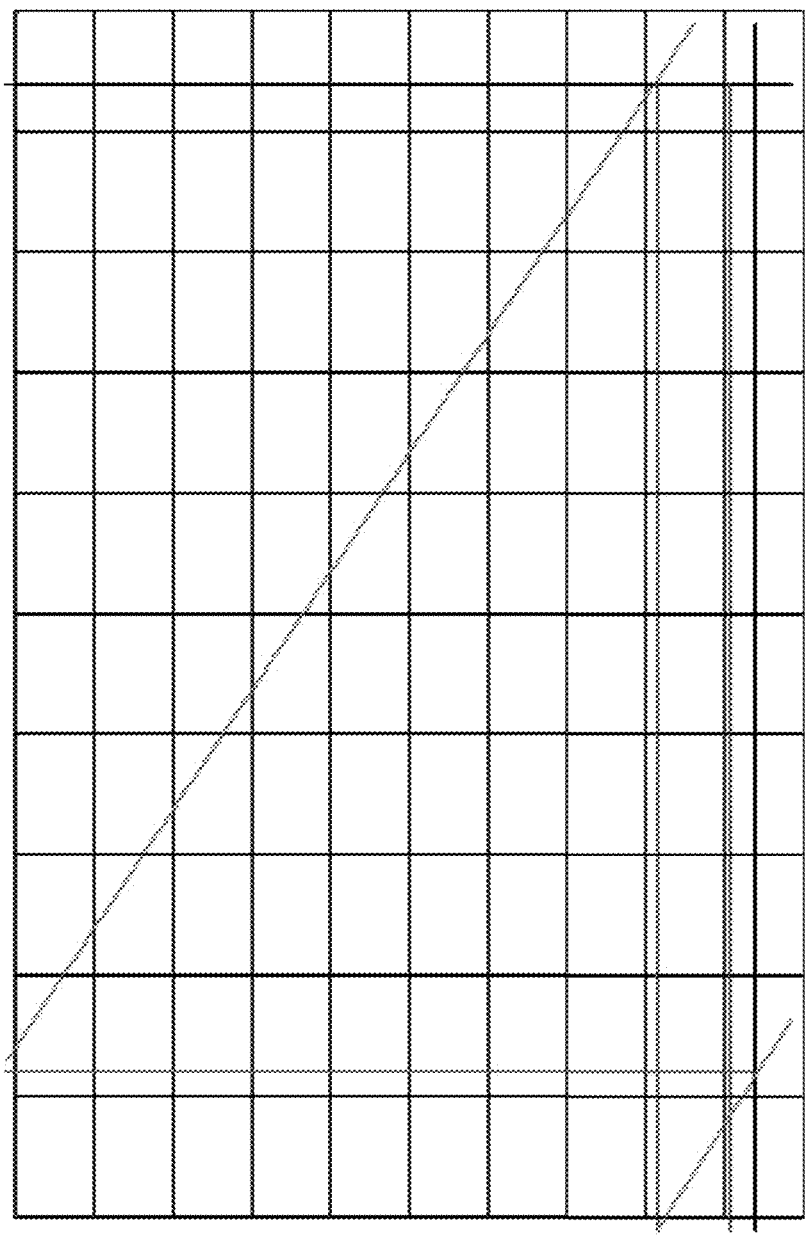

For the contiguous nodes within the same processing cycle, and that always having the same buffer read access address, they may share the same buffer, or at least use the same address generator. In FPGA design case, if the number of such nodes is large enough, a block RAM can be allocated; otherwise each node may use a separate distributed RAM which usually provides single bit width. In any case, these nodes may use the same address generator to reduce logic consumption. FIG. 3(b) to FIG. 3(d) give the different cases of address shifting and buffer sharing schemes, based on the example parallelization scheme More particularly, in FIG. 3(b), first '1' in first column falls in last segment, and the corresponding node belongs to processing element of a ∈[0:7]. For $L_{cv}$ first cycle, the inputs are from $R_{cv}$[59][a:b] and $R_{cv}$[0][0:c]. where b=7, c=a−b+17. Then $R_{rc}$[59][a:b] is stored in buffer $R_{cv}$[59][d:18] where d=18+a−b. $L_{cv}$ second and other remaining cycles are from $R_{cv}$[0][c+1:18] and $R_{cv}$[1][0:c], so buffer sharing is be among: max(d, c+1):18 and 0:c which is a+11:18, 0:a+10.

In FIG. 3(c) first '1' in first column does not fall in last segment, and the corresponding node belongs to processing element of a ∈[8:18]. In this example figure, for $L_{cv}$ first cycle, the inputs are from $R_{cv}$[58][a:18], $R_{cv}$[59][0:b], and $R_{cv}$[0][0:c]. where b=7, c=a−b−2. Then $R_{cv}$[59][0:b] is stored in buffer $R_{cv}$[59][d:a−1] where d=a−b−1. $L_{cv}$ second and other remaining cycles are from $R_{cv}$[0][c+1:18] and $R_{cv}$[1][0:c], so buffer sharing is be among: max(d, c+1):18, 0:c, and max(d, c+1):a−1, which gives a:18, 0:c, and d:a−1

In FIG. 3(d), where first '1' in first column does not fall in last segment, and the corresponding node belongs to processing element of a ∈[0:8]. In this example figure, for $L_{cv}$ first cycle, the inputs are from $R_{cv}$[58] [a:18], and $R_{cv}$[59][0:b]. where b=a−1. Then $R_{cv}$[59][b+1:c] is stored in buffer $R_{cv}$[59][e:8] where e=a+11. For other remaining cycles i, $L_{cv}$ is from $R_{cv}$[i][e:18] and $R_{cv}$[i+1][0:d] where d=e−1. second and other remaining cycles are from $R_{cv}$[0][c+1:18] and $R_{cv}$[1][0:c]. So the different ranges are {0:a−1 and a:18}, {0:a+10 and a+11:18}, which gives overlapped ranges of {0:a−1, a+11:18, and a:a+10} which is the buffer sharing range.

As may be appreciated, the above described methods according to the present disclosure may be applicable to a conversion from V-node to C-node as well.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in Appendix A to the application. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

The invention claimed is:

1. A high speed long codeword decoder comprising:
a plurality of pipelined stages including an input stage and an output stage communicatively coupled to a plurality of intermediate stages, wherein said input stage is configured to receive an input vector and convert it to a C-node processing sequence, said intermediate stages configured to perform C-node to V-node conversion, V-node operation, and V-node to C-node conversion, and said output stage being configured to perform V-node to output sequence conversion;
computer executable code to execute a Check-To-Variable Message Passing code, where each check node c computes the check-to-variable message $R_{CV}$ with variable-to-check message $L_{CV}$ as $$R_{CV} = \prod_{n \in N(c)\backslash v} \text{sign}(L_{CN}) \times \Psi\left\{\sum_{n \in N(c)\backslash v} \Psi(|L_{CN}|)\right\}$$

where $$\Psi(\beta) = \ln\left(\frac{e^\beta + 1}{e^{\beta-1}}\right).$$

and computer executable code to perform Variable-to-check Message Passing, wherein each variable node v computes the variable-to-checkmessage $L_{CV}$ with check-to-variable message $R_{CV}$, $$L_{CV} = \Sigma_{m \in M(v)\backslash c} R_{mv} + I_v.$$

2. The high speed long codeword decoder of claim 1 further configured such that each one of the pipelined stages is effected in one iteration of operation.

3. The high speed long codeword decoder of claim 2 further configured such that all of the V-nodes (variable node) process all column circulants in parallel and within each circulant column V-nodes are grouped into a single processing cycle.

4. The high speed long codeword decoder of claim 3 further configured such that all of the C-nodes (check node) process all row circulants in parallel and within each circulant row C-nodes are grouped into a single processing cycle.

5. The high speed long codeword decoder of claim 4 wherein from check node output to variable node input, there exist three processing stages to change node order for processing.

6. The high speed long codeword decoder of claim 5 wherein from variable node output to check node input there exist three processing stages to change node order for processing.

7. The high speed long codeword decoder of claim 5 wherein the three processing stages include a first multiplexer matrix, a buffer and a second multiplexer matrix.

8. The high speed long codeword decoder of claim 6 wherein the three processing stages include a first multiplexer matrix, a buffer matrix and a second multiplexer matrix.

9. The high speed long codeword decoder of claim 7 wherein the first multiplexer matrix comprises at least one 2:1 multiplexer.

10. The high speed long codeword decoder of claim 9 wherein the 2:1 multiplexer is only used for those nodes involving a last processing group.

11. The high speed long codeword decoder of claim 10 wherein the second multiplexer matrix comprises at least one 2:1 multiplexer and that multiplexer is only used for those nodes involving a last processing group.

12. The high speed long codeword decoder of claim 11 wherein the buffer matrix is interposed between check node output and variable node input and variable node output and check node input.

13. The high speed long codeword decoder of claim 12 wherein the buffer matrix is allocated such that write access conflict is prevented.

* * * * *